US009575092B2

(12) United States Patent
Frigoli et al.

(10) Patent No.: US 9,575,092 B2
(45) Date of Patent: Feb. 21, 2017

(54) VIBRATING DEVICE FOR POSITIONING A MINIATURIZED PIECE IN A TESTING ACCOMMODATION, AND POSITIONING METHOD

(71) Applicant: STMicroelectronics S.r.l., Agrate Brianza (IT)

(72) Inventors: Fabiano Frigoli, Milan (IT); Giuseppe Ballotta, Gerenzano (IT); Massimo Greppi, Basiano (IT); Luca Giuseppe Falorni, Limbiate (IT); Paolo Aranzulla, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 187 days.

(21) Appl. No.: 14/258,911

(22) Filed: Apr. 22, 2014

(65) Prior Publication Data
US 2014/0312925 A1    Oct. 23, 2014

(30) Foreign Application Priority Data

Apr. 22, 2013 (IT) .............................. TO2013A0324

(51) Int. Cl.
*G01R 1/04* (2006.01)
*G01R 31/28* (2006.01)

(52) U.S. Cl.
CPC ......... *G01R 1/0408* (2013.01); *G01R 31/2893* (2013.01); *G01R 1/0483* (2013.01); *G01R 31/2887* (2013.01); *G01R 31/2891* (2013.01)

(58) Field of Classification Search
CPC ............ G01R 31/2891; G01R 31/2887; G01R 31/2893; G01R 1/0408; G01R 1/0483
(Continued)

(56) References Cited

U.S. PATENT DOCUMENTS 2,982,916 A * 5/1961 Buchanan .......... G01R 31/2608
324/756.02
3,216,631 A * 11/1965 Mottin ................... B65G 47/24
221/267
(Continued)

FOREIGN PATENT DOCUMENTS

JP    58-084311    5/1983
JP    59-121226    7/1984

OTHER PUBLICATIONS

Search Report for Italian patent application No. 1020130324; Munich, Germany; Jan. 10, 2014, 2 pages.
(Continued)

*Primary Examiner* — Christopher McAndrew
(74) *Attorney, Agent, or Firm* — Gardere Wynne Sewell, LLP

(57) ABSTRACT

An embodiment of a device for positioning a miniaturized piece, including: a positioning structure, which forms a first cavity, designed to receive with play the miniaturized piece, and a second cavity communicating with the first cavity; at least one electrical-contact terminal, facing the second cavity and electrically coupleable to an electronic testing device, designed to carry out an electrical test on the miniaturized piece; and an actuator device, which causes a vibration of the positioning structure, the vibration being such that the miniaturized piece translates, in use, towards the second cavity, until it penetrates at least in part into the second cavity.

23 Claims, 7 Drawing Sheets

(58) Field of Classification Search
USPC .................................................. 324/750.16
See application file for complete search history.

(56) References Cited

U.S. PATENT DOCUMENTS

| | | | | |
|---|---|---|---|---|
| 3,337,941 | A * | 8/1967 | Drop | H01L 21/67144 |
| | | | | 219/158 |
| 4,406,373 | A * | 9/1983 | Braden | B07C 5/344 |
| | | | | 209/574 |
| 4,676,699 | A * | 6/1987 | Leonov | H01L 21/67784 |
| | | | | 406/86 |
| 5,673,799 | A * | 10/1997 | Braden | G01R 31/016 |
| | | | | 209/574 |
| 8,659,285 | B2 * | 2/2014 | Zieren | G01R 15/20 |
| | | | | 324/109 |
| 2006/0054774 | A1 * | 3/2006 | Yassour | B65G 51/03 |
| | | | | 248/631 |
| 2006/0181291 | A1 * | 8/2006 | Atwood | G01R 31/2887 |
| | | | | 324/750.25 |
| 2007/0212174 | A1 * | 9/2007 | Hayashi | B65G 47/22 |
| | | | | 406/93 |
| 2011/0316571 | A1 * | 12/2011 | Kiyokawa | G01R 31/2891 |
| | | | | 324/750.16 |
| 2014/0043053 | A1 * | 2/2014 | Huber | G01R 31/2887 |
| | | | | 324/750.16 |

OTHER PUBLICATIONS

Danilo Cambiaghi, and Gianluigi Frigerio, "Dispositivo e Metodo per il Posizionamento Preciso di un Pezzo Miniaturizzato in una Sede di Posizionamento", Italian patent application No. MI2010A001024; Milano, Italy, Jun. 9, 2010, 33 pages.

\* cited by examiner

US 9,575,092 B2

VIBRATING DEVICE FOR POSITIONING A MINIATURIZED PIECE IN A TESTING ACCOMMODATION, AND POSITIONING METHOD

PRIORITY CLAIM

The instant application claims priority to Italian Patent Application No. TO2013A000324, filed 22 Apr. 2013, which application is incorporated herein by reference in its entirety.

SUMMARY

An embodiment relates to a vibrating device for positioning a miniaturized piece in a desired accommodation, and in particular in a testing accommodation. Furthermore, an embodiment relates to a method for positioning a miniaturized piece.

As is known, there are today available devices for positioning miniaturized pieces. In particular, there are known devices for positioning integrated electronic circuits (chips), which are designed to receive integrated circuits from machinery of the so-called "pick-and-place" type, and to position these integrated circuits in testing positions, i.e., in positions in which the integrated circuits are electrically coupled to testing machinery.

By way of example, patent No. JP 58 084311, which is incorporated by reference, describes a positioning device including controlled-displacement fluidic means, which can be activated so as to exert a pneumatic force on a piece to be moved, this pneumatic force being designed to push the piece into a desired position.

Thanks to the use of pneumatic forces, the positioning device described in the patent No. JP 58 084311 is particularly suitable for positioning pieces having appreciable dimensions. However, precisely on account of the use of pneumatic forces, this positioning device could prove far from suitable for positioning very precisely pieces having very contained dimensions, such as, for example, integrated circuits.

An embodiment is a positioning device that overcomes the drawbacks of the known art, at least in part.

BRIEF DESCRIPTION OF THE DRAWINGS

For a better understanding of the concepts disclosed herein, embodiments are now described, purely by way of non-limiting examples, with reference to the following drawings.

DETAILED DESCRIPTION

Figure 1:
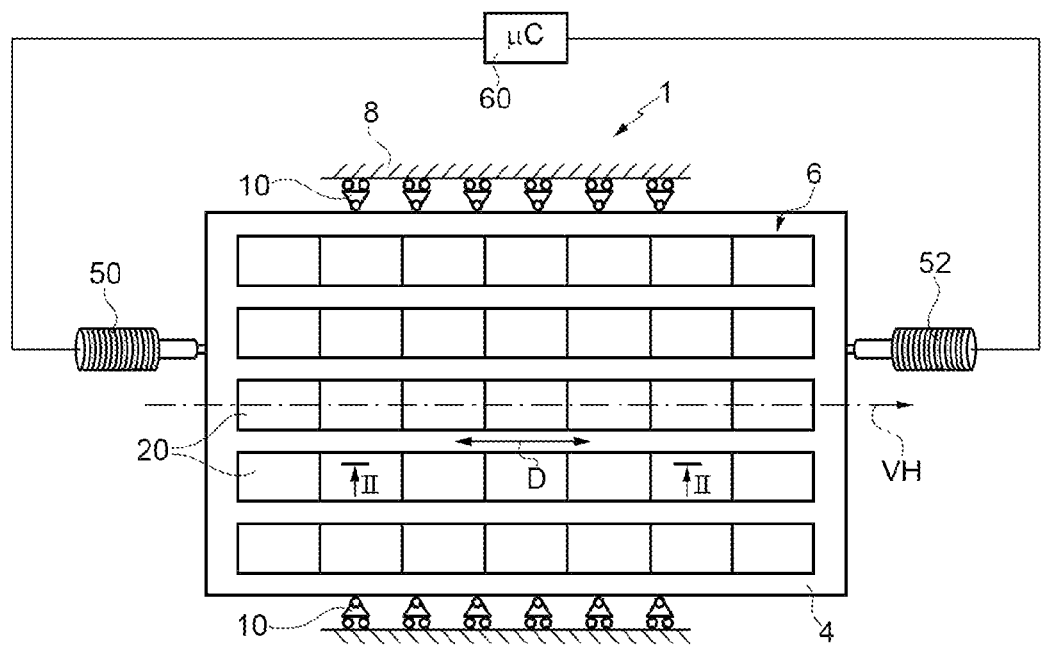
FIG. 1 shows a block diagram of a positioning device, according to an embodiment.
Figure 2:
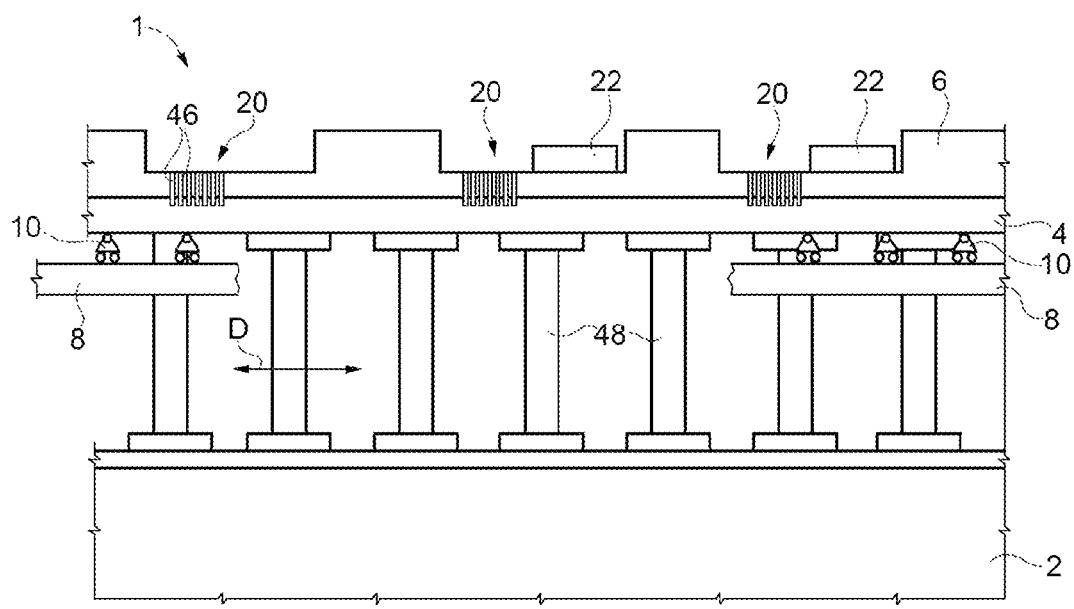
FIG. 2 is a schematic cross-sectional view of a portion of the positioning device of FIG. 1 and of testing machinery, according to an embodiment.

FIGS. 1 and 2 show a positioning device 1, which is designed to be electrically coupled to a testing device 2, which is also known as a "tester" 2.

In detail, the positioning device 1 includes a socket board 4 and a socket 6, which are fixed with respect to one another. Furthermore, the positioning device 1 includes a fixed frame 8.

The socket board 4 is mechanically coupled to the fixed frame 8 in such a way as to be able to slide with respect to the latter, in a direction of vibration D. For this purpose, present in the embodiment illustrated in FIGS. 1 and 2 is a plurality of bearings 10, which are precisely designed to enable movement of the socket board 4, and hence also of the socket 6 fixed thereto, with respect to the fixed frame 8, in both directions of the dimension of vibration D. In other words, the bearings 10 form a so-called "linear guide".

The socket 6 forms a plurality of positioning sites 20, each of which can house a corresponding miniaturized piece 22, of a type in itself known. In the following of the present description, it is assumed, without this implying any loss of generality, that the miniaturized pieces 22 are formed by corresponding integrated electronic circuits.

As is shown purely by way of example in FIG. 1, the positioning sites 20 are the same as one another and are arranged so as to form a planar array; i.e., they are arranged in rows and columns, the rows being arranged, for example, parallel to the dimension of vibration D.

Figure 3:
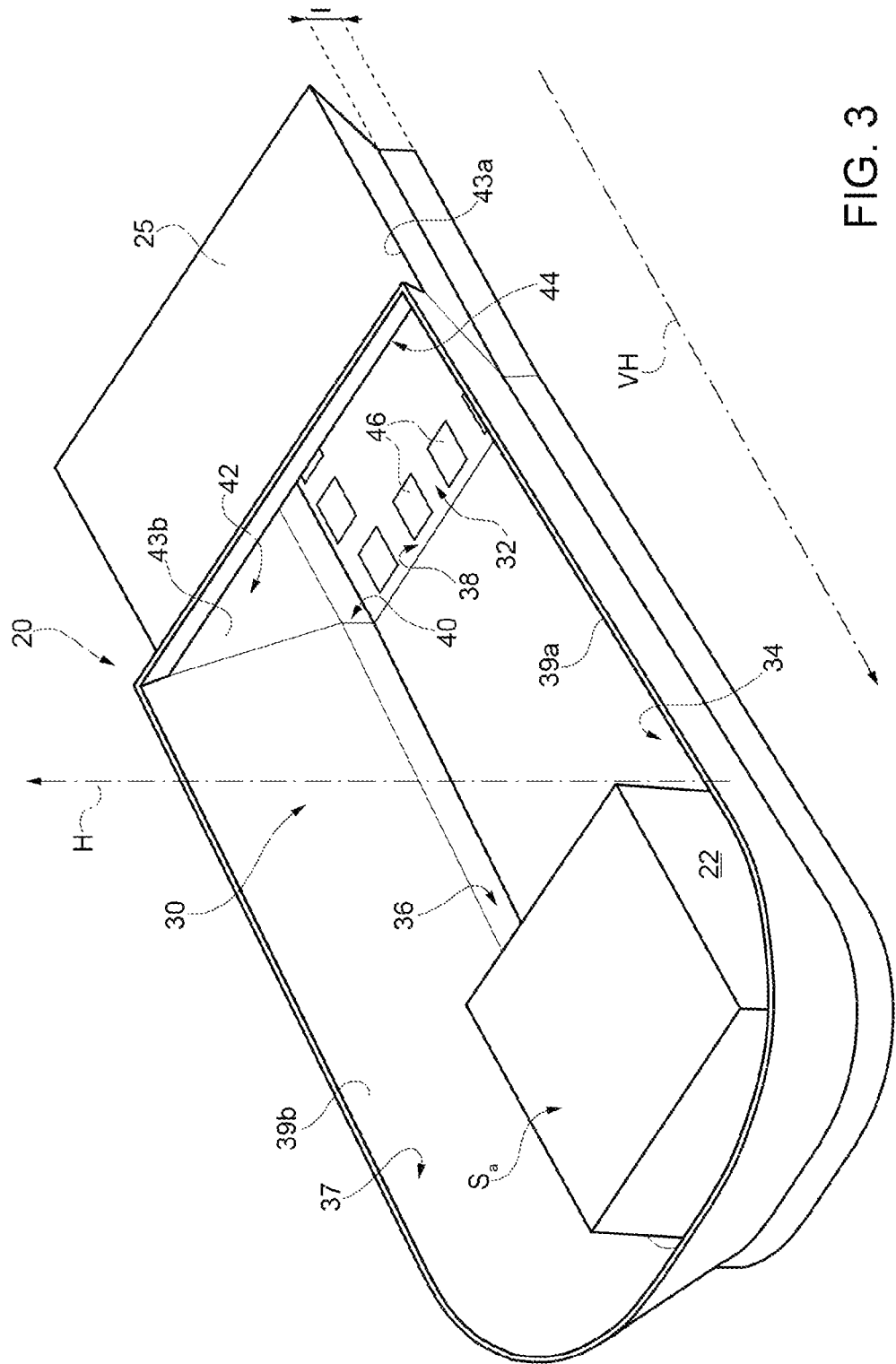
FIGS. 3, 7, and 8 show perspective views of portions of embodiments of a positioning device.

As is shown in greater detail in FIG. 3, each positioning site 20 includes a respective positioning structure 25, which delimits a first cavity 30 and a second cavity 32 that communicate with one another.

The first cavity 30 and the second cavity 32 are delimited at the bottom, respectively, by a first bottom surface 34 and a second bottom surface 38, which are formed by the positioning structure 25, are planar, are coplanar, and are designed to carry a miniaturized piece 22.

The first and second bottom surfaces 34 and 38 form a single piece and lie in a plane parallel to the dimension of vibration D. Furthermore, the first bottom surface 34 has the shape of a trapezium, the corners of which at the two vertices corresponding to the major base are chamfered; the minor base, instead, is coupled to the second bottom surface 38, which has the shape of a rectangle or a square. In particular, the side of the second bottom surface 38 that is coupled to the first bottom surface 34 is as long as the aforementioned minor base.

Given a vertical axis H, perpendicular to the first and second bottom surfaces 34 and 38, the first cavity 30 is open at the top and is delimited laterally by a first bottom lateral surface 36 and by a first top lateral surface 37, which are formed by the positioning structure 25.

The first bottom lateral surface 36 extends parallel to the vertical axis H with a height I, starting from the perimeter of the first bottom surface 34.

Consequently, the first bottom lateral surface 36 forms a sort of guide, which converges, i.e., decreases its own width, in a direction of the second cavity 32, until it has the same width as the second bottom surface 38, the widths being measured along an axis perpendicular to the vertical axis H and to the dimension of vibration D (the width is measured from one side of the bottom of the cavity 30 to the other side of the bottom of the cavity along an axis perpendicular to the axis H and the dimension D).

The first top lateral surface 37 extends above the first bottom lateral surface 36, to which it is coupled. Moreover, the first top lateral surface 37 is inclined with respect to the vertical axis H so as to assume a flared shape. In particular, assuming that the vertical axis H passes through the centroid of the first bottom surface 34 and is oriented from beneath upwards, i.e., it is set in such a way that the first top lateral surface 37 is arranged above the first bottom lateral surface 36, the first top lateral surface 37 is curved and defines a shape tapered towards the first bottom surface 34. In other words, given any secant plane perpendicular to the first bottom surface 34 and containing the vertical axis H, the distance from the vertical axis H to each point of the line of intersection present between the first top lateral surface 37 and the secant plane is proportional to the height of the point itself.

More in particular, the first top lateral surface 37 includes a first portion 39a and a second portion 39b, which are arranged specular to one another. Furthermore, each of them is inclined by an angle α with respect to a corresponding portion of the underlying first bottom lateral surface 36, the angle α being non-zero. Each portion 39a and 39b of the surface 37 is hence inclined with respect to the first bottom surface 34 by an angle β=90°−α, at the most equal to 45°.

The second cavity 32 is delimited laterally by a second bottom lateral surface 40 and by a second top lateral surface 42; moreover, the second cavity 32 is delimited at the top by a covering surface 44, which is coupled to the second top lateral surface 42. Also the second bottom lateral surface 40, the second top lateral surface 42, and the covering surface 44 are formed by the positioning structure 25.

Figure 4A:
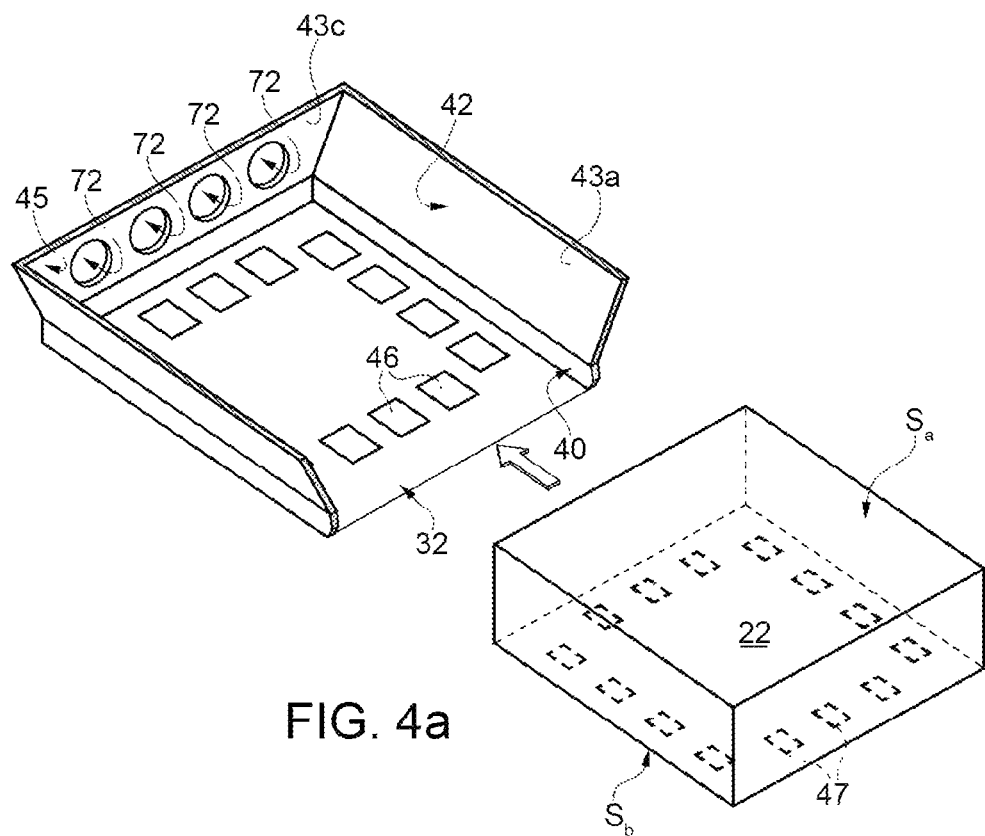
FIGS. 4a and 4b show perspective views of an integrated circuit and of a portion of the embodiment illustrated in FIG. 3, at two different instants in time.

The second bottom lateral surface 40 extends parallel to the vertical axis H with a height equal to I, starting from the perimeter of the second bottom surface 38. The second top lateral surface 42 extends above the second bottom lateral surface 40, to which it is coupled. Furthermore, the second top lateral surface 42 includes a first portion 43a (illustrated in FIG. 4a) and a second portion 43b, which are parallel to the dimension of vibration D and are inclined with respect to the vertical axis H by an angle equal to the angle α. Furthermore, the second top lateral surface 42 has a third portion 43c (illustrated in FIG. 4a), which forms, together with an underlying portion of the second bottom lateral surface 40, a back surface 45, which is arranged in a direction perpendicular to the dimension of vibration D.

In greater detail, assuming that we are considering a miniaturized piece 22 having, to a first approximation, the shape of a parallelepiped of negligible height and delimited at the top and at the bottom by a top main surface $S_a$ and a bottom main surface $S_b$, each of which has an area equal to A, the first bottom surface 34 has an area at least equal to 1.1*A. Consequently, the first cavity 30 is designed to receive the miniaturized piece 22 from, for example, a pick-and-place machine (not shown), and to house this miniaturized piece 22 with an appreciable play. Furthermore, thanks to the inclination of the first top lateral surface 37, in a case where the miniaturized piece 22 were not initially set by the pick-and-place machine in a precise way, i.e., the piece were to contact part of the first top lateral surface 37, it would subsequently slide on the bottom of the first cavity 30, with its own bottom main surface $S_b$ entirely in contact with the first bottom surface 34, as illustrated in FIG. 3. Purely by way of example, shown in FIG. 3 is a miniaturized piece 22 having a height greater than the height I of the first and second bottom lateral surfaces 36, 40; however, it is also possible for the height of the miniaturized piece 22 to be less than the height I.

The positioning device 1 further includes a plurality of electrical-contact terminals 46, which face the second bottom surface 38 so that they can be contacted by the miniaturized piece 22, as described hereinafter; the second cavity 32 hence defines an electrical-testing accommodation. In this coupling, extending on the bottom main surface $S_b$ of the miniaturized piece 22 is a plurality of conductive pads 47.

In use, the tester 2 is set underneath the fixed frame 8, which in turn is overlaid, in order, by the socket board 4 and by the socket 6. Furthermore, the electrical-contact terminals 46 are electrically coupled to the tester 2 by means of corresponding electrical connections (not shown), which extend through the socket 6, the socket board 4, and a plurality of flexible connections 48 (FIG. 2) of a mechanical type.

As shown once again in FIG. 1, the positioning device 1 further includes a first actuator 50 and a second actuator 52, which are electrically controlled.

The first and second actuators 50 and 52 are of a piezoresistive type. Moreover, the first and second actuators 50 and 52 are fixed with respect to the fixed frame 8 and are mechanically coupled to the socket board 4 in such a way that by electrically controlling in a way in itself known these first and second actuators 50 and 52, it is possible to bring about vibration, with respect to the fixed frame 8, of the socket board 4, and hence also of the socket 6, parallel to the dimension of vibration D.

More in particular, the positioning device 1 includes an electronic control unit 60, which is designed to control the first and second actuators 50 and 52 by generating corresponding electrical control signals in such a way as to cause oscillation of the socket board 4 about a resting position.

Figure 5:
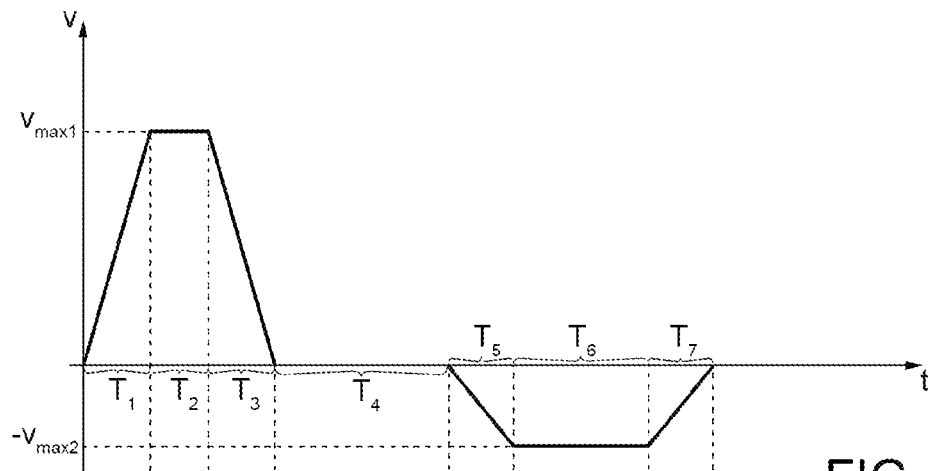
FIGS. 5 and 6 show, respectively, the time plots of the speed and of the acceleration to which a portion of a positioning device is subjected, according to an embodiment.

Even more in particular, the electronic control unit 60 controls the first and second actuators 50 and 52 in such a way that the socket board 4 will follow, in time, a non-symmetrical speed profile, as shown purely by way of example in FIG. 5.

Before describing in detail the aforementioned non-symmetrical speed profile, it is pointed out that the positioning sites 20 are oriented in space all in the same way. It is hence possible to define a vibration axis VH (FIGS. 1 and 2) parallel to the dimension of vibration D, passing, for example, through the centroid of the socket 6 and oriented in such a way that, given any positioning site 20, it is parallel, and with concordant sense, to a hypothetical vector, which connects the centroids of the first and second bottom surfaces 34, 38 and is oriented from the centroid of the second bottom surface 38 to the centroid of the first bottom surface 34. In practice, given any positioning site 20, the vibration axis VH is parallel to an axis of symmetry of the surface formed by the set of the corresponding first and second bottom surfaces 34, 38; moreover, the vibration axis VH is oriented towards the corresponding first cavity 30.

In what follows, reference is made to vector quantities (velocities and accelerations), implying the fact that they are oriented parallel to the dimension of vibration D. Furthermore, given a vector quantity, by convention it is assumed that it has positive sense in the case where its sense is concordant with the sense of the vibration axis VH. Consequently, it is assumed that this vector quantity has negative sense in the case where its sense is opposite to the sense of the vibration axis VH.

This being said, for each period of oscillation $T_O$, during a first period $T_1$ the socket board 4 is accelerated with an acceleration $\vec{a}_1$, which is positive and constant. In particular, the socket board 4 is accelerated starting from an initial instant in which it has zero speed until it reaches a first maximum speed $v_{max1}$.

During a second period $T_2$, the socket board 4 is kept at constant speed, this speed being equal, for example, precisely equal, to $v_{max1}$.

Next, during a third period $T_3$ having a duration equal to the first period $T_1$, the speed of the socket board 4 is decreased, until the socket board 4 is brought into conditions of zero speed. For this purpose, the socket board 4 is subjected to an acceleration $\vec{a}_2$ which is negative and has a modulus equal to the modulus of the acceleration $\vec{a}_1$.

Next, during a fourth period $T_4$, the socket board 4 is kept stationary.

Next, during a fifth period $T_5$, the socket board 4 is accelerated with an acceleration $\vec{a}_3$, which is negative and constant. In particular, the socket board 4 is accelerated until it reaches a second maximum speed $-v_{max2}$. Even more in particular, the modulus of the acceleration $\vec{a}_3$, is less than the modulus of the acceleration $\vec{a}_1$.

Next, during a sixth period $T_6$, the socket board 4 is kept at constant speed, this speed being equal to, for example, precisely equal to, $-v_{max2}$.

Next, during a seventh period $T_7$ having a duration equal to the fifth period $T_5$, the speed of the socket board 4 is decreased (in absolute value) until the socket board 4 is brought back into conditions of zero speed. For this purpose, the socket board 4 is subjected to an acceleration $\vec{a}_4$, which is positive and has a modulus equal to the modulus of the acceleration $\vec{a}_3$.

The speed profile followed by the socket board 4 during each period of oscillation A is such that the time integral of the speed profile itself is zero. In this way, as mentioned previously, the socket board 4, and consequently also the socket 6, vibrates about a resting position. Furthermore, since with reference to a given positioning site 20 the speed profile to which the respective positioning structure 25 is subjected is the same profile to which the socket board 4 is subjected, also the positioning structure 25 vibrates about a respective resting position. During this vibration, the respective first and second cavities 30 and 32 move fixedly with respect to one another.

Figure 6:
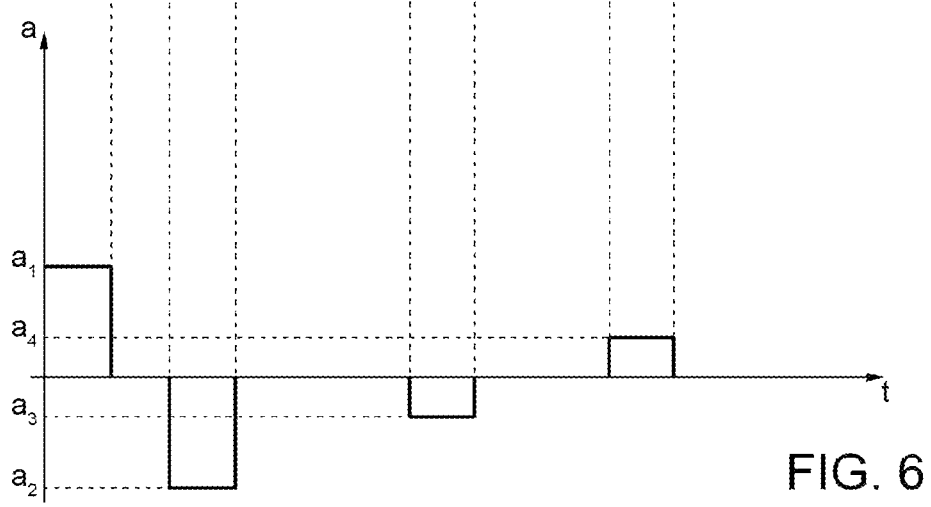

In greater detail, each positioning structure 25 is subjected to an acceleration profile, an example of which is illustrated in FIG. 6. The acceleration profile is such that, basically throughout the time interval formed by the first, second, and third periods $T_1$, $T_2$, $T_3$, there is, on the hypothesis that the miniaturized piece 22 has been set in the first cavity 30, a relative motion of the miniaturized piece 22 with respect to the first bottom surface 34. In particular, in a reference system fixed with respect to the positioning structure 25, the miniaturized piece 22 moves with a sense opposite to the sense of the vibration axis VH; i.e., it moves in the direction of the second cavity 32. This is due to the fact that the acceleration $\vec{a}_1$ is such that the miniaturized piece 22 is subjected to a force greater, in modulus, than the force of static sliding friction to which the miniaturized piece 22 is subjected, which depends, as is known, upon the mass of the miniaturized piece 22, upon the materials that form the miniaturized piece 22 and the first bottom surface 34, as well as upon the roughness of the surfaces of the miniaturized piece 22 and of the first bottom surface 34 that are in contact with one another. Translation of the miniaturized piece 22 towards the second cavity 32 is hence due to the fact that, during the aforementioned time interval, the forces of friction present between the miniaturized piece 22 and the first bottom surface 34 are not sufficient to cause the miniaturized piece 22 to move fixedly with the first bottom surface 34.

The acceleration profile is moreover such that, throughout the time interval formed by the fourth, fifth, sixth, and seventh periods $T_4$, $T_5$, $T_6$, $T_7$, little or no relative motion of the miniaturized piece 22 with respect to the first bottom surface 34 occurs; at least the relative motion of the piece 22 is less, in magnitude, during this time interval as compared to the previous time interval.

Figure 4B:
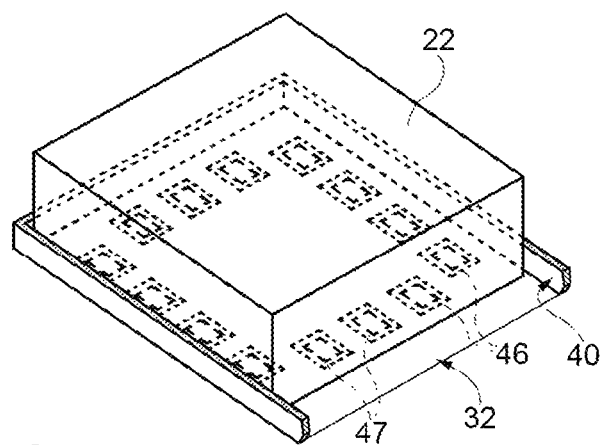

Following upon the succession of periods of oscillation $T_O$, the miniaturized piece 22 hence tends to move in the direction of the second cavity 32. In particular, the converging guide formed by the first bottom lateral surface 36 causes the miniaturized piece 22 to penetrate gradually into the second cavity 32, setting itself so as to overlie the second bottom surface 38, and hence also the electrical-contact terminals 46, as illustrated in FIG. 4*b*. In practice, the miniaturized piece 22 translates, as a result of the vibrations of the positioning structure 25 until it comes into contact with the side/end surface 45.

Unlike the first cavity 30, the second cavity 32 is not accessible to the pick-and-place machine and is calibrated according to the shape of the miniaturized piece 22; i.e., it is sized so as to receive the miniaturized piece 22 with little or no play. In other words, the width of the second bottom surface 38 is substantially equal to the width of the bottom main surface $S_b$ of the miniaturized piece 22, but for the tolerance associated to the latter width, so as to enable entry of the miniaturized piece 22 into the second cavity 32. For instance, the miniaturized piece 22 can have a tolerance as regards its width equal to one tenth of a millimeter.

Figure 7:
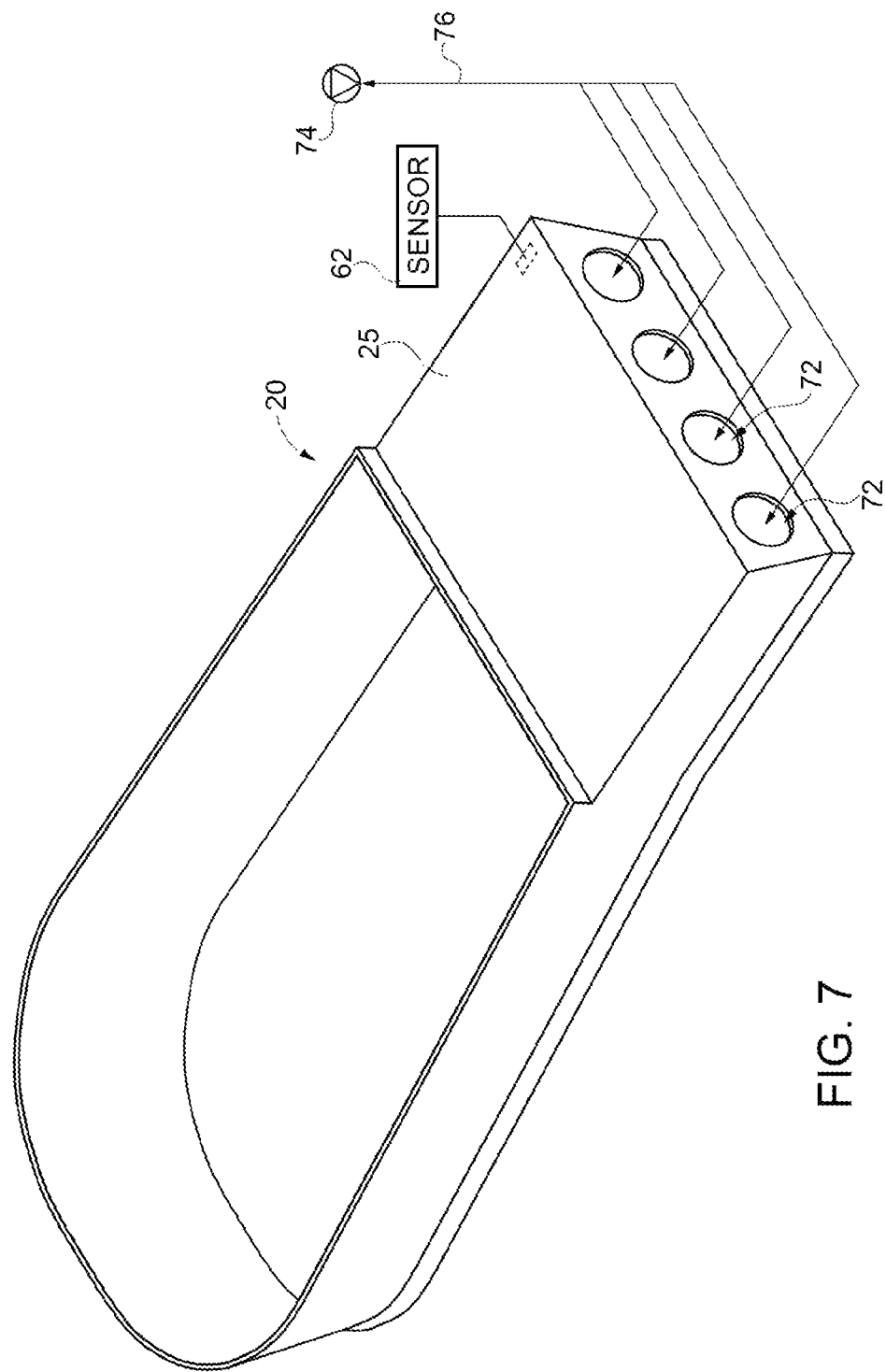

The third portion 43*c* of the second top lateral surface 42 has a plurality of side/end holes 72 of a through type. In addition, as illustrated in FIG. 7, the positioning device 1 includes a pneumatic pump 74, which is mechanically coupled to the holes 72 by means of a pneumatic connection 76 (represented symbolically).

In use, the pneumatic pump 74 is designed to keep the miniaturized piece 22 stationary in contact with the bottom surface 45 in order to enable subsequent execution of the test by the tester 2. In practice, the pneumatic pump 74 is designed to cause the miniaturized piece 22, after contacting the bottom surface 45, to remain in contact with the bottom surface 45, i.e., to maintain a testing position, where the conductive pads 47 of the miniaturized piece 22 contact corresponding electrical contact terminals 46. In these conditions, the miniaturized piece 22 is in electrical contact with the tester 2, which can hence carry out an electrical test on the miniaturized piece 22 in a way in itself known.

In detail, the pneumatic pump 74 generates a suction force that keeps the miniaturized piece 22 in contact with the bottom surface 45 thanks to the creation of a negative pressure in an area corresponding to the bottom surface 45 itself. This suction force has a limited modulus since it is not required to perform the task of moving the miniaturized piece 22 from the first cavity 30 to the second cavity 32. The suction force is limited, in fact, to keeping the miniaturized piece 22 substantially stationary after it has reached the testing position, following upon the vibrational movements of the positioning structure 25, preventing the miniaturized piece 22 from bouncing on account of the impact against the side/end surface 45. In other words, the suction force just keeps the miniaturized piece 22 in the testing position.

Possible effects of sticking between the surface 45 and the miniaturized piece 22 also contribute to keeping the latter in the testing position.

The modulus of the suction force may hence be less than the modulus that would be necessary in the case where this suction force were to overcome the static sliding friction between the miniaturized piece 22 and the bottom surfaces of the positioning structure 25.

The pneumatic pump 74 can moreover be used for generating a flow of gas that passes through the holes 72, which is such as to move the miniaturized piece 22 away from the side/end surface 45, after the test has terminated.

In order to enable proper timing of the operations performed by the positioning device 1, the latter further includes, for each second cavity 32, a corresponding sensor 62, which is a so-called vacuum sensor of a type in itself known (for example, of an electro-optical or else pneumatic type), which is designed to generate an electrical vacuum signal, indicating whether a miniaturized piece is or is not in contact with the corresponding side/end surface 45.

The electronic control unit 60 is moreover coupled to the sensors 62 and to the pneumatic pumps 74 and controls operation thereof. In particular, after the pick-and-place machine has set the miniaturized pieces 22 in the corresponding first cavities 30, the electronic control unit actuates the pneumatic pumps 74 in such a way that they will generate negative pressures in an area corresponding to the end surfaces 45 of the positioning sites 25.

Next, the electronic control unit 60 controls the first and second actuators 50 and 52 so as to generate the vibration. This leads to translation of the miniaturized pieces. Furthermore, even though in practice the miniaturized pieces 22 reach the respective end surfaces 45 at different instants in time, the use of the pneumatic pumps 74 enables onset, at a given instant in time, of a situation in which all the miniaturized pieces 22 are set in the respective testing positions. This situation is detected by the electronic control unit 60 on the basis of the electrical vacuum signals generated by the sensors 62. In practice, as a whole the sensors 62 form a position sensor designed to supply a signal indicating that the corresponding testing positions have been reached by all the miniaturized pieces 22.

Following the detection of all the miniaturized pieces 22 having reached the testing positions, the electronic control unit 60 controls the first and second actuators 50 and 52 so as to stop the vibration.

Next, the electronic control unit 60 switches the pneumatic pumps 74 off, and the tester 2 carries out testing of the miniaturized pieces 22.

Finally, the electronic control unit 60 controls the pneumatic pumps 74 in such a way that they generate flows of gas that push the miniaturized pieces 22 again into the first cavities 30, where they can be handled by the pick-and-place machine.

Figure 8:
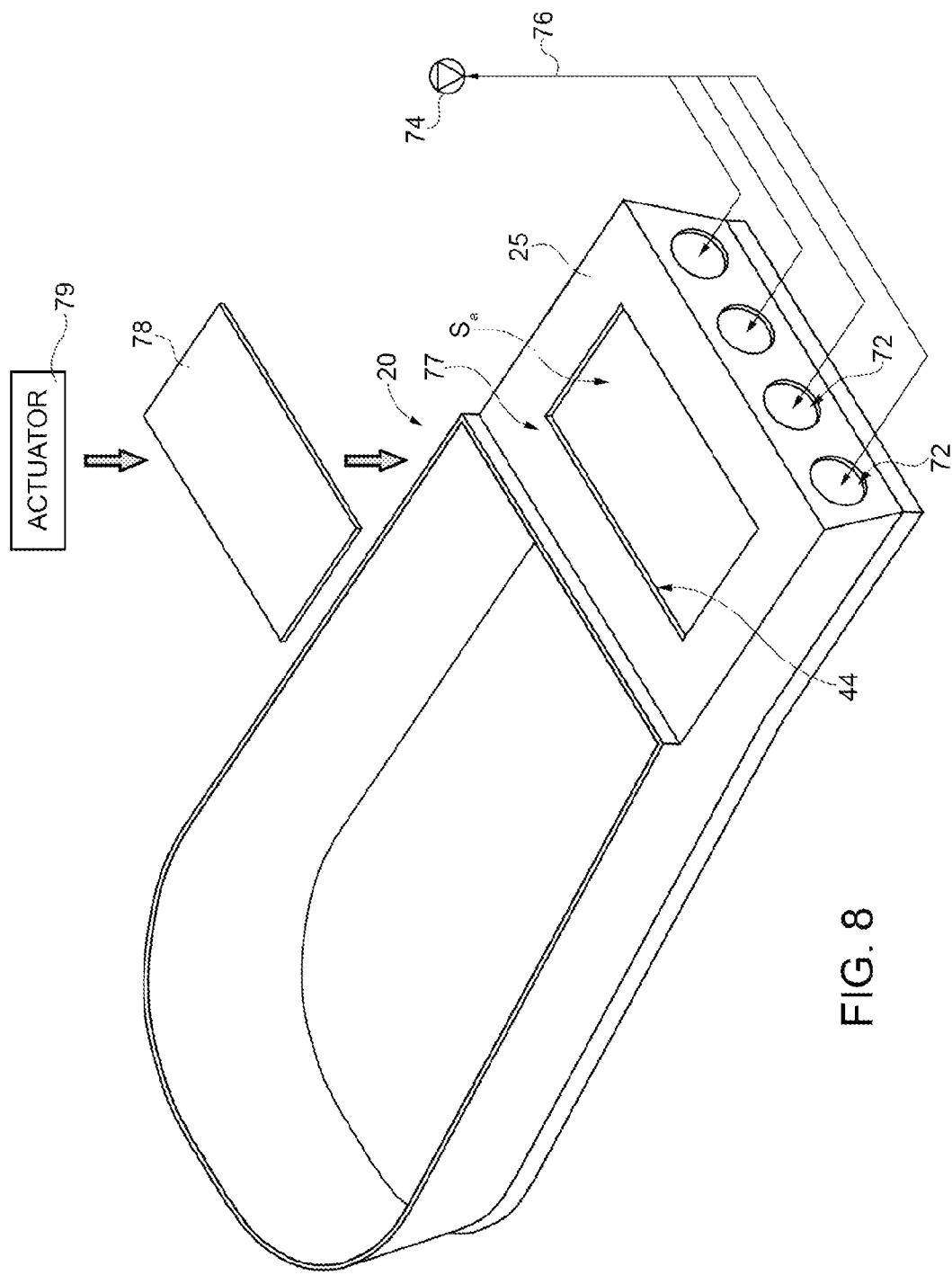

It is noted that, even though in the embodiments shown so far the covering surface 44 of each positioning site 20 is planar and closes the entire second cavity 32 underlying it at the top, there are, however, possible embodiments in which the covering surface 44 is hollow, i.e., it forms a top hole 77, of a through type. An example of such embodiments is illustrated in FIG. 8. In this case, the positioning device 1 further includes a plate 78 and a third actuator 79, for example of a mechanical type, which is controlled by the electronic control unit 60 and is designed to move the plate 78 in such a way that, passing through the top hole 77, the plate 78 exerts a pressure on the top main surface $S_a$ of the miniaturized piece 22. In this way, the plate 78 presses the miniaturized piece 22 against the second bottom surface 38, substantially guaranteeing electrical contact between the conductive pads 47 and the electrical contact terminals 46.

Figure 9:
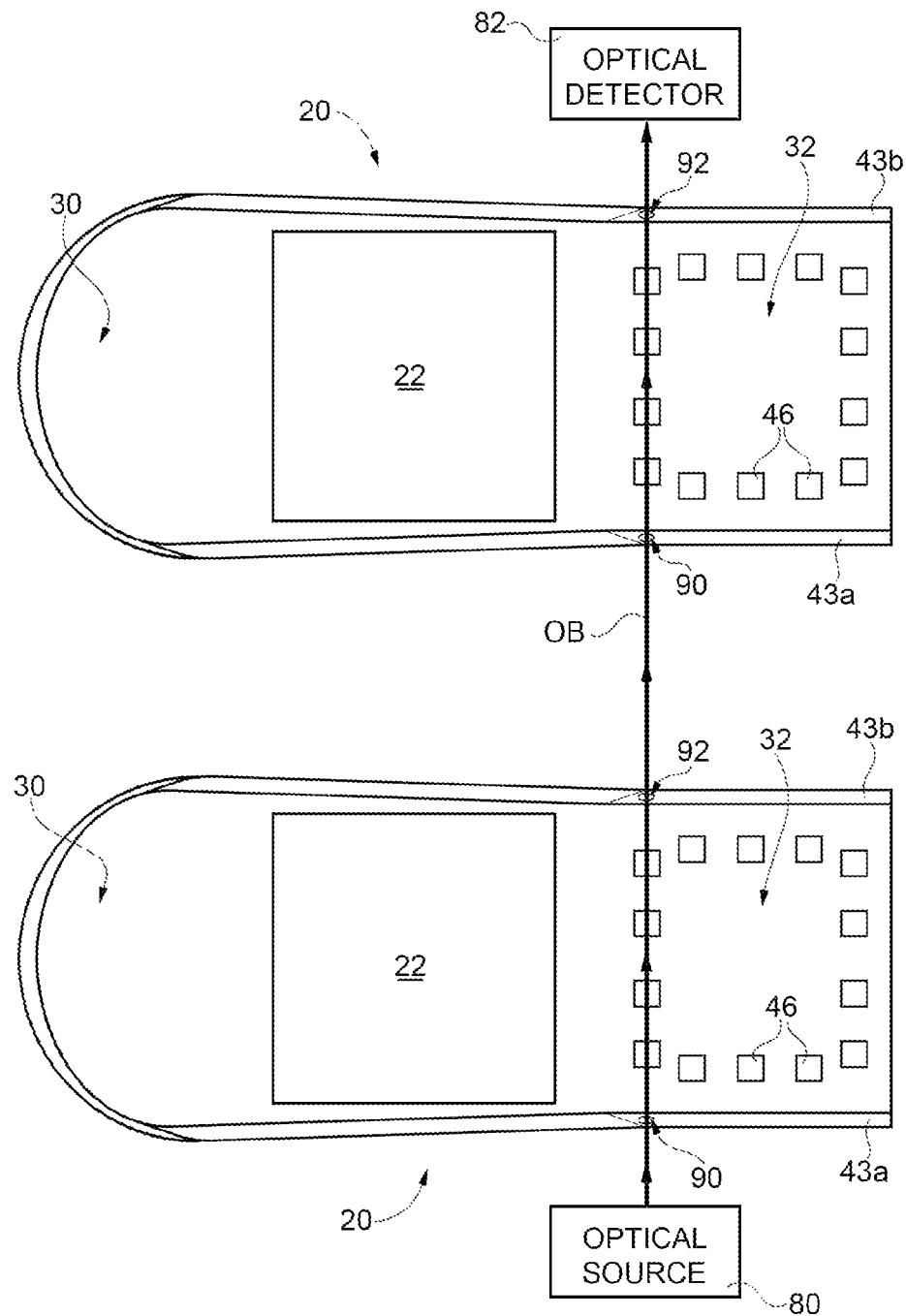
FIG. 9 is a schematic top plan view of a portion of an embodiment of a positioning device.

As illustrated in FIG. 9, the positioning device 1 may moreover include, for each column of positioning sites 20, an optical source 80 and an optical detector 82, which are fixed with respect to the socket 6. The optical source 80 is designed to emit an optical beam OB. In this case, each second cavity 32 has a lateral inlet hole 90 and a lateral outlet hole 92, which are of a through type and are set, respectively, on the first portion 43a and on the second portion 43b of the second top lateral surface 42 so as to be aligned in a direction perpendicular to the dimension of vibration D and to the corresponding vertical axis H.

In particular, considering a column of positioning sites 20, all the lateral inlet holes 90 and outlet holes 92 are aligned with one another. Furthermore, the respective optical source 80 and the respective optical detector 82 are set in such a way that, when all the miniaturized pieces 22 have been moved away from the second cavities 32 that had housed them previously, the optical beam OB emitted by the optical source 80 traverses all the lateral inlet holes and outlet holes 90, 92 and is received by the optical detector 82. In practice, the optical source 80 and the optical detector 82 are coupled by an optical path, which is interrupted in the case where there is at least one miniaturized piece 22 set within a corresponding second cavity 32. In particular, the optical path is obstructed in the case where this miniaturized piece 22 penetrates into this second cavity 32 for more than a minimum length, measured in a direction parallel to the dimension of vibration D. In this case, the optical beam OB is not received by the optical detector 82.

The optical detector 82 is hence able to generate an electrical signal indicating alternatively either recession of all the miniaturized pieces 22 from the second cavities 32 of the positioning sites 20 of the column considered or else residual presence of at least one miniaturized piece 22 within a corresponding second cavity 32. This electrical signal can hence be used for controlling, for example, the pick-and-place machine in order to recover the miniaturized pieces 22, once the electrical test is completed.

Advantages that the present positioning device affords emerge clearly from the foregoing description. In particular, the present positioning device 1 enables positioning of miniaturized pieces 22 within testing accommodations, in a way substantially irrespective of the precision with which the pick-and-place machine has positioned the miniaturized pieces 22 themselves within the first cavities 30 of the positioning sites 20. At the limit, even the miniaturized pieces that have been set by the pick-and-place machine vertically with respect to the corresponding first bottom surfaces 34 are subsequently set within the corresponding second cavities 32. In fact, given any second cavity 32, the corresponding covering surface 44 is arranged in such a way that a possible piece set vertically within the first cavity 30, by impacting against the covering surface 44, drops, setting itself in such a way that its own bottom main surface $S_b$ lies in the plane of the first and second bottom surfaces 34 and 38.

In particular, reaching of the testing positions by the miniaturized pieces 22 and hence alignment thereof is obtained using a vibratory mechanism and mechanical lead-ins.

Finally, it is clear that modifications and variations may be made to what has been described and illustrated herein, without thereby departing from the sphere of protection of the claims.

For instance, instead of the bearings 10, other mechanical coupling means may be used. It is moreover possible for the socket board 4 and the fixed frame 8 to be juxtaposed, without interposition of any bearing. In this case, a lubricating liquid may be set between the socket board 4 and the fixed frame 8.

In regard to the first and second cavities 30 and 32 of each positioning site 20, they may have different shapes from those described above. Furthermore, in addition to or instead of the holes 72, there may be present suction holes, arranged, for example, in the first and second portions 43a, 43b of the second top lateral surface 42 of each positioning site 20.

In regard to the first and second actuators 50 and 52, they may be of a type different from what has been described. For instance, the first and second actuators 50 and 52 may be of an electromechanical type.

It is moreover possible for the pneumatic pumps 74 to be kept turned on during execution of the test by the tester 2.

In addition, removal of the miniaturized pieces 22 from the second cavities 32, once the test is completed, may be performed by means of a mechanism different from the one that has been described, such as, for example, a mechanism designed to exert impulsive forces of impact, instead of pneumatic forces, on the miniaturized pieces 22.

Finally, embodiments are possible in which the second cavity 32 is sized so as to receive the miniaturized piece 22 with a limited play. In this case, the width of the second bottom surface 38 exceeds the width of the bottom main surface $S_b$ of the miniaturized piece 22 for not more than approximately 1/20 of the width of the bottom main surface $S_b$ of the miniaturized piece 22.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. An apparatus, comprising:
a holder including a first receptacle configured to receive an electronic device in a first direction from an external source, the electronic device having a conductive signal pad, and a second receptacle configured to receive the electronic device from the first receptacle in a second direction that is substantially orthogonal to the first direction, wherein the holder includes a bottom, the first receptacle and the second receptacle sharing the bottom of the holder, and wherein the second receptacle has a conductive signal terminal; and
a positioner configured to move the electronic device from the first receptacle, along the second direction, into the second receptacle to a position where the conductive signal pad is in electrical contact with the conductive signal terminal.

2. The apparatus of claim 1 wherein:
the first receptacle is larger than the electronic device; and
the second receptacle is smaller than the first receptacle.

3. The apparatus of claim 1 wherein the first receptacle includes a side wall having a first portion that extends from and is substantially perpendicular to the bottom, and a second portion that extends from the first portion and tapers outward, wherein the second portion is configured to guide the electronic device into the first portion using gravity.

4. The apparatus of claim 1 wherein the holder includes a cover disposed over the second receptacle.

5. The apparatus of claim 1 wherein the holder includes a removable cover disposed over the second receptacle.

6. The apparatus of claim 1 wherein:
the second receptacle includes an end wall having an opening; and
the positioner is configured to generate, within the second receptacle via the opening, a pressure that is different from a pressure outside of the second receptacle.

7. The apparatus of claim 1 wherein:
the second receptacle includes an end wall having an opening; and
the positioner is configured to generate, within the second receptacle via the opening, a vacuum that holds the electronic device in a position in which the conductive signal pad contacts the conductive signal terminal.

8. The apparatus of claim 1 wherein:
the second receptacle includes an end wall having an opening; and
the positioner is configured to generate, within the second receptacle via the opening, a pressure sufficient to eject the electronic device from the second receptacle into the first receptacle along a direction opposite to the second direction.

9. The apparatus of claim 1 wherein the holder includes a sensor configured to indicate whether the electronic device is positioned within the second receptacle such that the conductive signal pad contacts the conductive signal terminal.

10. The apparatus of claim 1 wherein the positioner is configured to move the electronic device from the first receptacle into the second receptacle by moving the holder back and forth.

11. The apparatus of claim 1, further comprising a tester coupled to the conductive signal terminal and configured to test the electronic device while the electronic device is disposed in the second receptacle.

12. The apparatus of claim 1, further comprising the electronic device.

13. A method, comprising:
moving an electronic device having a conductive signal pad in a first linear direction to place the electronic device into a first receptacle of a holder, the first receptacle having a bottom and a side wall having a first portion that extends from and is substantially perpendicular to the bottom; and
causing the electronic device to move in a second linear direction substantially perpendicular to the first linear direction from the first receptacle into a second receptacle of the holder so as to place the conductive signal pad into contact with a conductive signal terminal disposed in said second receptacle of the holder, wherein the second receptacle shares the bottom and the side wall with the first receptacle.

14. The method of claim 13, wherein moving the electronic device includes placing the electronic device into the first receptacle with a pick-and-place machine.

15. The method of claim 13, wherein causing includes:
moving the holder in a first vibration direction according to a first velocity profile; and
moving the holder in a second vibration direction opposite to the first direction according to a second velocity profile.

16. The method of claim 13, wherein causing includes:
moving the holder in a first vibration direction according to a first acceleration profile; and moving the holder in a second vibration direction opposite to the first direction according to a second acceleration profile.

17. The method of claim 13, wherein causing includes:

moving the holder in a first vibration direction such that the electronic device moves toward the second receptacle; and moving the holder in a second vibration direction opposite to the first direction such that the electronic device does not move away from the second receptacle.

18. The method of claim 13, wherein causing includes:

moving the holder in a first vibration direction such that the electronic device moves a first distance toward the second receptacle; and moving the holder in a second vibration direction opposite to the first direction such that the electronic device moves a second distance away from the second receptacle, the second distance less than the first distance.

19. The method of claim 13, wherein causing includes:

moving the holder in a first vibration direction such that the electronic device moves toward the second receptacle; and moving the holder in a second vibration direction opposite to the first direction such that the electronic device does not move.

20. The method of claim 13, wherein causing includes moving the holder back and forth multiple times.

21. The method of claim 13, wherein causing comprises:

reducing a pressure in the second receptacle;

creating a pressure differential between the first receptacle and the second receptacle; and overcoming a friction between the electronic device and the holder using the pressure differential until the conductive signal pad is in contact with the conductive signal terminal.

22. The method of claim 21, further comprising:

increasing the pressure in the second receptacle after the conductive signal pad is in contact with the conductive signal terminal;

creating a negative pressure differential between the first receptacle and the second receptacle; and ejecting the electronic device from the second receptacle into the first receptacle using the negative pressure differential.

23. The apparatus of claim 1, wherein the first direction is vertical and the second direction is horizontal.

* * * * *